(12) United States Patent
Xu et al.

(10) Patent No.: US 12,274,137 B2
(45) Date of Patent: Apr. 8, 2025

(54) DISPLAY SUBSTRATE AND DISPLAY DEVICE WITH LEAD LINES

(71) Applicant: BOE Technology Group Co., Ltd., Beijing (CN)

(72) Inventors: Pan Xu, Beijing (CN); Dacheng Zhang, Beijing (CN); Xing Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 446 days.

(21) Appl. No.: 17/640,230

(22) PCT Filed: Jan. 29, 2021

(86) PCT No.: PCT/CN2021/074469
§ 371 (c)(1),
(2) Date: Mar. 3, 2022

(87) PCT Pub. No.: WO2022/160276
PCT Pub. Date: Aug. 4, 2022

(65) Prior Publication Data
US 2023/0165080 A1 May 25, 2023

(51) Int. Cl.
*H01L 29/08* (2006.01)
*G09G 3/3233* (2016.01)
(Continued)

(52) U.S. Cl.
CPC ......... *H10K 59/131* (2023.02); *G09G 3/3233* (2013.01); *H10K 59/1201* (2023.02);
(Continued)

(58) Field of Classification Search
CPC ............. H10K 59/131; H10K 59/1213; H10K 59/1216
(Continued)

(56) References Cited

U.S. PATENT DOCUMENTS 9,835,917 B2 12/2017 Zhao et al.
10,879,319 B2 12/2020 Bang et al.
(Continued)

FOREIGN PATENT DOCUMENTS

CN 106057820 A 10/2016
CN 106707646 A 5/2017
(Continued)

OTHER PUBLICATIONS

Extended European Search Report, mailed Sep. 19, 2023, from European App No. 21922089.4, 8 pages.
(Continued)

*Primary Examiner* — Phuc T Dang
(74) *Attorney, Agent, or Firm* — Workman Nydegger

(57) ABSTRACT

A display substrate and a display device, include: a base substrate, which includes a display area, and a bonding area (BA) disposed on one side of the display area; a plurality of gate lines, a plurality of data lines, a plurality of lead lines, the plurality of lead lines each is respectively electrically connected with a respective one of the plurality of data lines, each of the plurality of lead lines includes a first portion extending in the second direction, and orthographic projections of at least part of the first portions on the base substrate do not overlap with orthographic projections of the data lines on the base substrate.

20 Claims, 13 Drawing Sheets

(51) Int. Cl.
*H10K 59/12* (2023.01)
*H10K 59/121* (2023.01)
*H10K 59/131* (2023.01)
*H10K 59/35* (2023.01)

(52) U.S. Cl.
CPC ..... *H10K 59/1213* (2023.02); *H10K 59/1216* (2023.02); *H10K 59/1315* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *H10K 59/35* (2023.02)

(58) Field of Classification Search
USPC .......................................................... 257/40
See application file for complete search history.

(56) References Cited

U.S. PATENT DOCUMENTS

| | | | |
|---|---|---|---|
| 10,978,447 | B2 | 4/2021 | Kim et al. |
| 11,183,543 | B2 | 11/2021 | Bang et al. |
| 11,625,069 | B2 * | 4/2023 | Bang ................ G06F 1/189 361/679.02 |
| 11,678,537 | B2 | 6/2023 | Choi et al. |
| 11,871,624 | B2 | 1/2024 | Son et al. |
| 11,943,956 | B2 | 3/2024 | Woo et al. |
| 2013/0033834 | A1 * | 2/2013 | Kwon ................ H10K 59/8794 445/25 |
| 2016/0225304 | A1 | 8/2016 | Kim |
| 2018/0173346 | A1 | 6/2018 | Du et al. |
| 2019/0326336 | A1 | 10/2019 | Xi et al. |
| 2020/0090559 | A1 | 3/2020 | Song et al. |
| 2020/0174525 | A1 | 6/2020 | Feng |
| 2020/0312252 | A1 | 10/2020 | Jeong et al. |
| 2020/0342791 | A1 | 10/2020 | Song et al. |
| 2020/0343331 | A1 | 10/2020 | Jeong et al. |
| 2021/0005631 | A1 | 1/2021 | Wang et al. |
| 2021/0020724 | A1 | 1/2021 | Cho et al. |
| 2021/0090490 | A1 * | 3/2021 | Lee ................ G06F 1/1637 |
| 2021/0233899 | A1 | 7/2021 | Lu |
| 2021/0257435 | A1 | 8/2021 | Kim et al. |
| 2021/0273035 | A1 | 9/2021 | Cho et al. |
| 2021/0399262 | A1 | 12/2021 | Woo et al. |
| 2021/0408214 | A1 | 12/2021 | Wang et al. |

FOREIGN PATENT DOCUMENTS

| | | | | |
|---|---|---|---|---|
| CN | 106782270 | A | | 5/2017 |
| CN | 107170783 | A | | 9/2017 |
| CN | 107656646 | A | | 2/2018 |
| CN | 107919090 | A | | 4/2018 |
| CN | 108153438 | A | | 6/2018 |
| CN | 108319397 | A | * | 7/2018 .......... G06F 3/0412 |
| CN | 109448555 | A | | 3/2019 |
| CN | 110148606 | A | | 8/2019 |
| CN | 110286534 | A | | 9/2019 |
| CN | 110910774 | A | | 3/2020 |
| CN | 111522463 | A | | 8/2020 |
| CN | 111653603 | A | | 9/2020 |
| CN | 111755476 | A | | 10/2020 |
| CN | 111886925 | A | * | 11/2020 .......... H01L 27/124 |
| CN | 112180644 | A | | 1/2021 |
| CN | 112185267 | A | | 1/2021 |
| CN | 112216721 | A | | 1/2021 |
| CN | 112242425 | A | | 1/2021 |
| EP | 3748682 | A1 | | 12/2020 |
| IN | 110085643 | A | | 8/2019 |
| JP | 2000-28642 | A | | 1/2000 |
| TZ | 201518748 | A | * | 5/2015 ............. G09G 3/006 |
| WO | WO-2015081672 | A | * | 6/2015 ............. H01L 21/77 |
| WO | 2020017835 | A1 | | 1/2020 |

OTHER PUBLICATIONS

Extended European Search Report, mailed Sep. 21, 2023, from European App No. 21922090.2, 8 pages.

US Non-Final Office Action, mailed May 2, 2024, from U.S. Appl. No. 17/629,772, 32 pages.

* cited by examiner

Poly

SD1

DISPLAY SUBSTRATE AND DISPLAY DEVICE WITH LEAD LINES

CROSS REFERENCE TO RELATED APPLICATIONS

The present disclosure is a National Stage of International Application No. PCT/CN2021/074469, filed Jan. 29, 2021.

FIELD

The present disclosure relates to the technical field of display, in particular to a display substrate and a display device.

BACKGROUND

As the technology in the display industry becomes more and more mature, the application scenarios of a display device are becoming more and more complex, the display device in a regular shape cannot meet use requirements any more, and accordingly a special-shaped display device gradually comes into the view of people.

SUMMARY

Embodiments of the present disclosure provide a display substrate and a display device.

On one aspect, the embodiment of the present disclosure provides a display substrate, including:
  a base substrate, including a display area and a bonding area disposed on one side of the display area;
  a plurality of gate lines, extending in a first direction and arranged in a second direction in the display area, wherein the first direction and the second direction are arranged in an intersecting mode;
  a plurality of data lines, arranged in a different layer with the plurality of gate lines, and extending in the second direction and arranged in the first direction in the display area; and
  a plurality of lead lines, arranged in a different layer with the plurality of gate lines and the plurality of data lines, wherein the plurality of lead lines extend to the bonding area in the second direction from the display area, the plurality of lead lines each is electrically connected with a respective one of the plurality of data lines, each of the plurality of lead lines includes a first portion extending in the second direction, and orthographic projections of at least part of the first portions on the base substrate do not overlap with orthographic projections of the data lines on the base substrate.

In some embodiments, the plurality of lead lines are arranged symmetrically with respect to a center axis of the display area in the second direction.

In some embodiments, the lead lines adjacent to the center axis of the display area in the second direction include the first portion; and
  the lead lines away from the center axis of the display area in the second direction includes: the first portions, and a second portions extending in a middle area of the display area in the first direction, orthographic projections of at least part of the second portions on the base substrate do not overlap with orthographic projections of the gate lines on the base substrate.

In some embodiments, the display substrate further includes: a plurality of pixel units distributed in an arrayed mode; in a gap between two adjacent rows of pixel units extending in the first direction, a first distance between two adjacent second portions is equivalent.

In some embodiments, lengths of the second portions arranged in sequence in a direction from the display area to the bonding area are gradually increasing.

In some embodiments, each of the plurality of lead lines further includes: a third portion extending in the first direction in an edge area of the display area; orthographic projections of the third portion on the base substrate do not overlap with the orthographic projections of the gate lines on the base substrate; and the third portion is electrically connected with the corresponding data line.

In some embodiments, the first portions of the lead lines away from the center axis of the display area in the second direction comprise: first sub-portions and second sub-portions; first ends of the first sub-portions are electrically connected with the third portions, and second ends of the first sub-portions are electrically connected with first ends of the second portions adjacent to a boundary of the display area; first ends of the second sub-portions are electrically connected with second ends of the second portions away from the boundary of the display area, and second ends of the second sub-portions are located in the bonding area; and in the first direction, a maximum distance between adjacent first sub-portions is greater than a maximum distance between adjacent second sub-portions.

In some embodiments, every two adjacent data lines are in a data line set, every three data line sets are in a cycle period, and the three data line sets in one cycle period are a first data line set, a second data line set and a third data line set successively arrayed in the first direction; and
  two first sub-portions correspondingly electrically connected with two data lines in the first data line set are arranged on two sides of the first data line set, two first sub-portions correspondingly electrically connected with two data lines in the second data line set are arranged in a gap between the first data line set and the second data line set, and two first sub-portions correspondingly electrically connected with two data lines in the third data line set are arranged on the side of the third data line set away from the second data set.

In some embodiments, the larger a distance between the first sub-portions and the center axis of the display area in the second direction, the shorter lengths of the first sub-portions.

In some embodiments, one ends of the plurality of lead lines away from the bonding area are electrically connected with one ends of the plurality of data lines away from the bonding area.

In some embodiments, the display substrate further includes: a plurality of pixel driving circuits located in an area defined by the plurality of gate lines and the plurality of data lines, each of the plurality of pixel driving circuit comprises a driving transistor and a storage capacitor;
  a first electrode of the storage capacitor is reused as a gate electrode of the driving transistor, a second electrode of the storage capacitor is arranged between a layer where the gate electrode of the driving transistor is located and a layer where the data lines are located, and the orthographic projections of at least part of the plurality of lead lines on the base substrate overlap with orthographic projections of the gate electrodes of the driving transistors on the base substrate.

In some embodiments, a ratio of an overlapping area, of the orthographic projections of the plurality of lead lines on the base substrate and the orthographic projections of the gate electrodes of the driving transistors on the base substrate, to an area of the gate electrodes of the driving transistors is less than ⅓.

In some embodiments, the display substrate further includes: a plurality of pixel driving circuits arranged in an area defined by the plurality of gate lines and the plurality of data lines;

each of the plurality of pixel driving circuits comprises a driving transistor; and the orthographic projections of the plurality of lead lines on the base substrate and the orthographic projections of the gate electrodes of the driving transistors on the base substrate do not overlap with each other.

In some embodiments, the display substrate further includes: an organic insulating layer arranged between a layer where the plurality of data lines are located and a layer where the plurality of lead lines are located; and the plurality of lead lines each is electrically connected with the respective one of the plurality of the data lines through a first via hole penetrating through the organic insulating layer.

In some embodiments, the display substrate further includes: an inorganic insulating layer arranged between the organic insulating layer and the layer where the plurality of lead lines are located; and the plurality of lead lines each is electrically connected with the respective one of the plurality of data lines through a second via hole penetrating through the inorganic insulating layer, and the first via hole and the second via hole corresponding to each of the plurality of lead lines are arranged in a penetrating mode.

In some embodiments, the display substrate further includes a plurality of light-emitting devices disposed on one sides of the plurality of lead lines facing away from the base substrate; and the plurality of light-emitting devices constitute a plurality of light-emitting device columns extending in the second direction, and the larger a distance between the light-emitting device columns and a center axis of the display area in the second direction is, the smaller quantity of the light-emitting devices contained in the light-emitting device columns is.

On the other aspect, embodiments of the present disclosure provide a display device, including the above display substrate.

In some embodiments, the display device further includes: a source electrode driving chip, which includes a plurality of signal channels;

the source electrode driving chip comprises a plurality of signal channels;

the plurality of signal channels are electrically connected with the plurality of lead lines in a one-to-one correspondence mode in the bonding area; and in the first direction, a width of the plurality of lead lines in the bonding area and a width of the plurality of signal channels are equivalent.

DETAILED DESCRIPTION OF THE EMBODIMENTS

Figure 1:
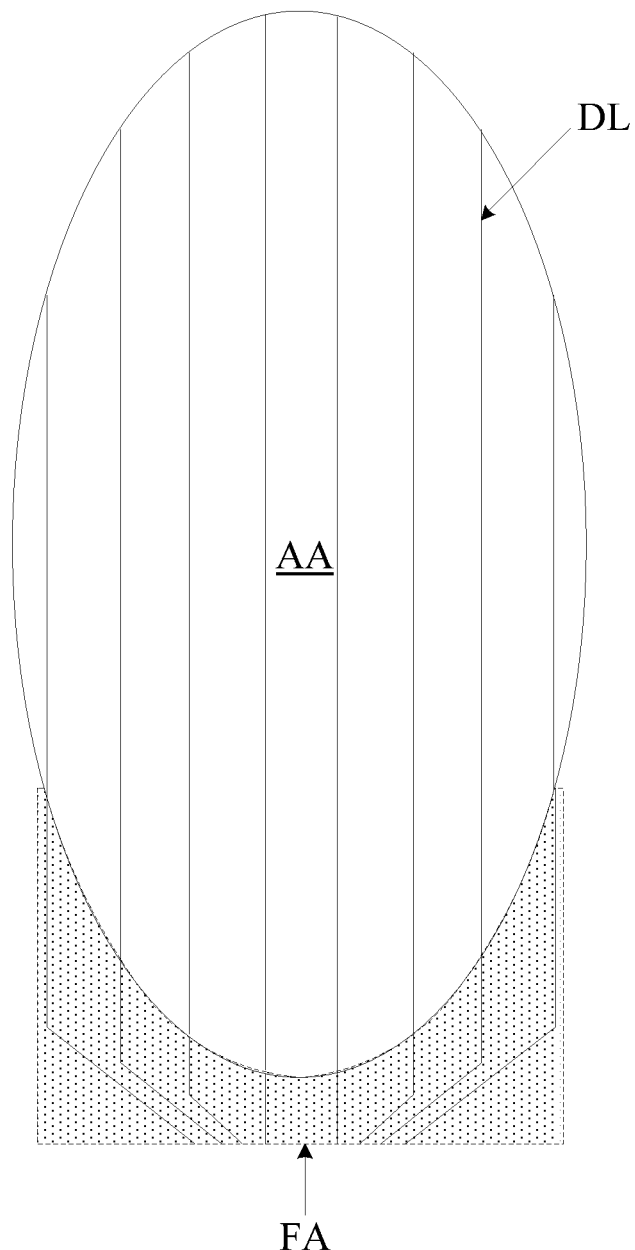
FIG. 1 is a structural schematic diagram of a display substrate in a related art.

In order to make the objective, implementations and advantages of embodiments of the present disclosure more clear, the implementations in embodiments of the present disclosure will be described clearly and completely by combining with the accompanying drawings in embodiments of the present disclosure. It should be noted that sizes and shapes of all diagrams in the accompanying drawings do not reflect true proportions, and only aim to illustrate contents of the present invention. Moreover, the same or similar mark numbers represent the same or similar elements or elements having the same or similar functions from beginning to end. Obviously, the described embodiments are part of embodiments of the present disclosure, but not all embodiments. On the basis of embodiments in the present disclosure, all other embodiments obtained by those ordinarily skilled in the art without inventive efforts fall within the protection scope of the present disclosure.

Unless otherwise defined, technical or scientific terms used in the present disclosure should have ordinary meanings which are understood by those ordinarily skilled in the art of the present disclosure. "First", "second" and other similar words used in the present disclosure do not denote any sequence, quantity or significance and are only used for distinguishing different components. "Include" or "contain" or other similar words means that an element or an item preceding the word covers elements or items and their equivalents listed after the word without excluding other elements or items. "connect" or "connect with" or similar words are not restricted to physical or mechanical connection, but may include electrical connection, either directly or indirectly. "Upper", "lower", "left", "right" and the like are only used to represent a relative position relation, and when an absolute position of a described object changes, the relative position relation may change correspondingly.

In order to keep the following instructions of embodiments of the present disclosure clear and simple, the present disclosure omits detailed descriptions to known functions and known components.

In the related art, there are a circular watch, a "fringe" mobile phone screen and the like in mature special-shaped display devices, which have a relatively small size, or a shape approximate to a traditional rectangular screen, so that connecting a source electrode driving chip (Source IC) and a fan-out line of a data line (DL) contained in a special-shaped display area (AA) may not occupy a frame largely. Moreover, for a special-shaped screen in a "singularity" shape, such as a round shape, an oval shape and a heart shape, having a large size and a high resolution ratio, a fan-out line is designed according to a traditional manner, in which the frame area needs to be occupied largely.

In the related art, a special-shaped display device generally adopts a source drain metal layer to manufacture a fan-out line located on the frame area FA. For performance: as shown in FIG. 1, a data line (DL) of the source drain metal layer is electrically connected with a source electrode driving chip through same layer arrangement and the fan-out line distributed in a fan shape in the frame area, in which the frame area is occupied largely.

Figure 2:
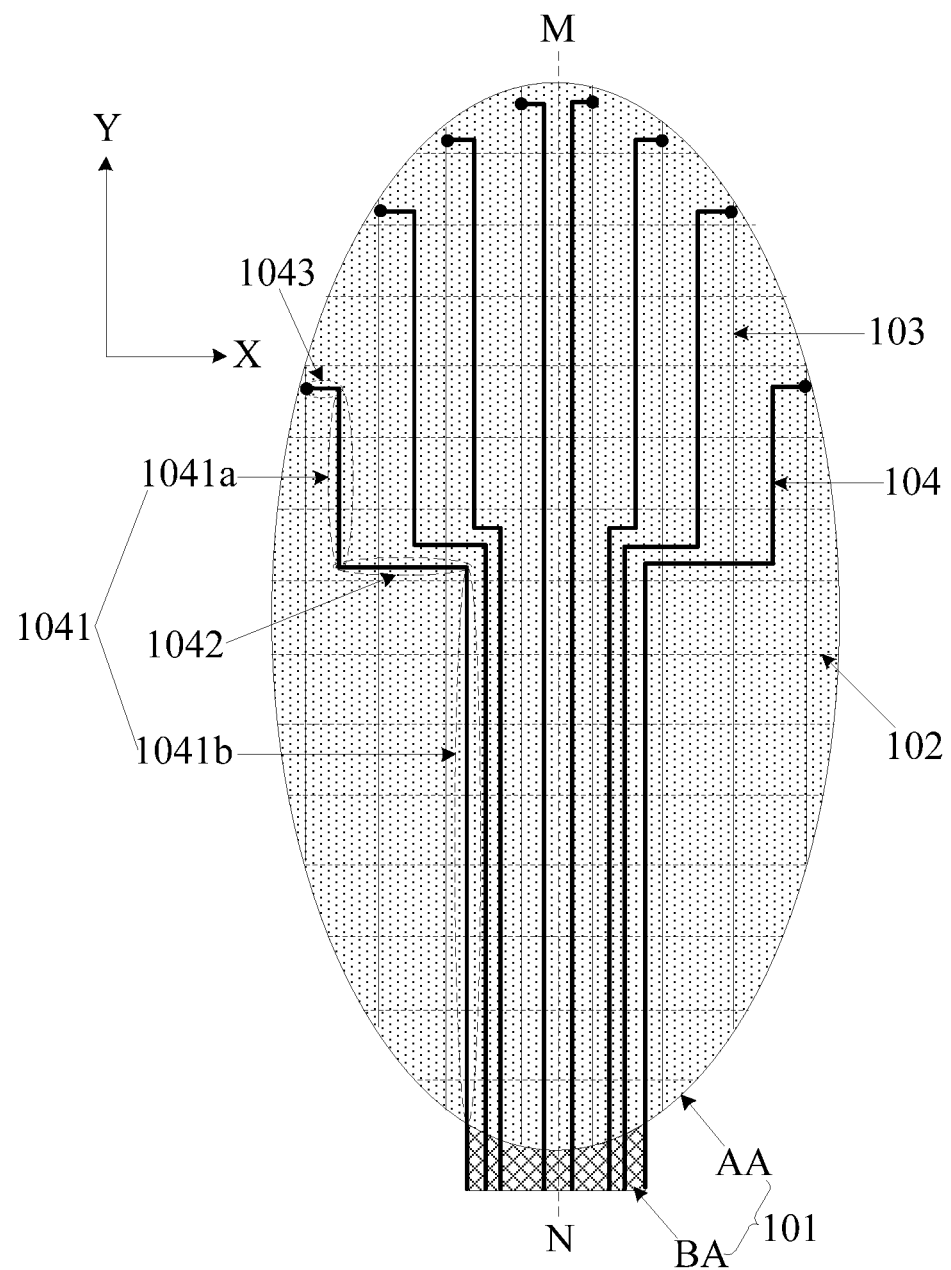
FIG. 2 is a structural schematic diagram of a display substrate provided by an embodiment of the present disclosure.
Figure 3:
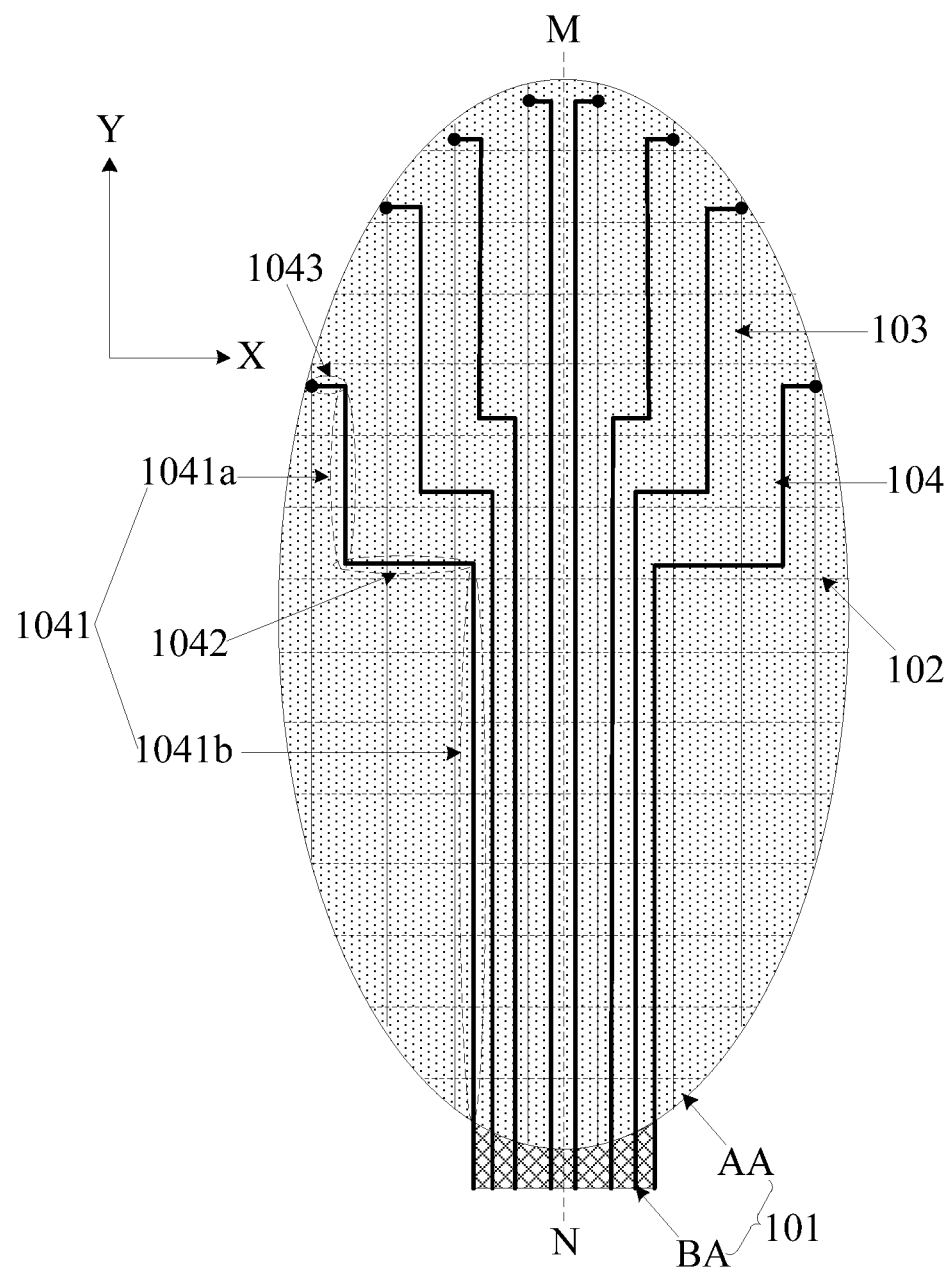
FIG. 3 is yet another structural schematic diagram of a display substrate provided by an embodiment of the present disclosure.
Figure 4:
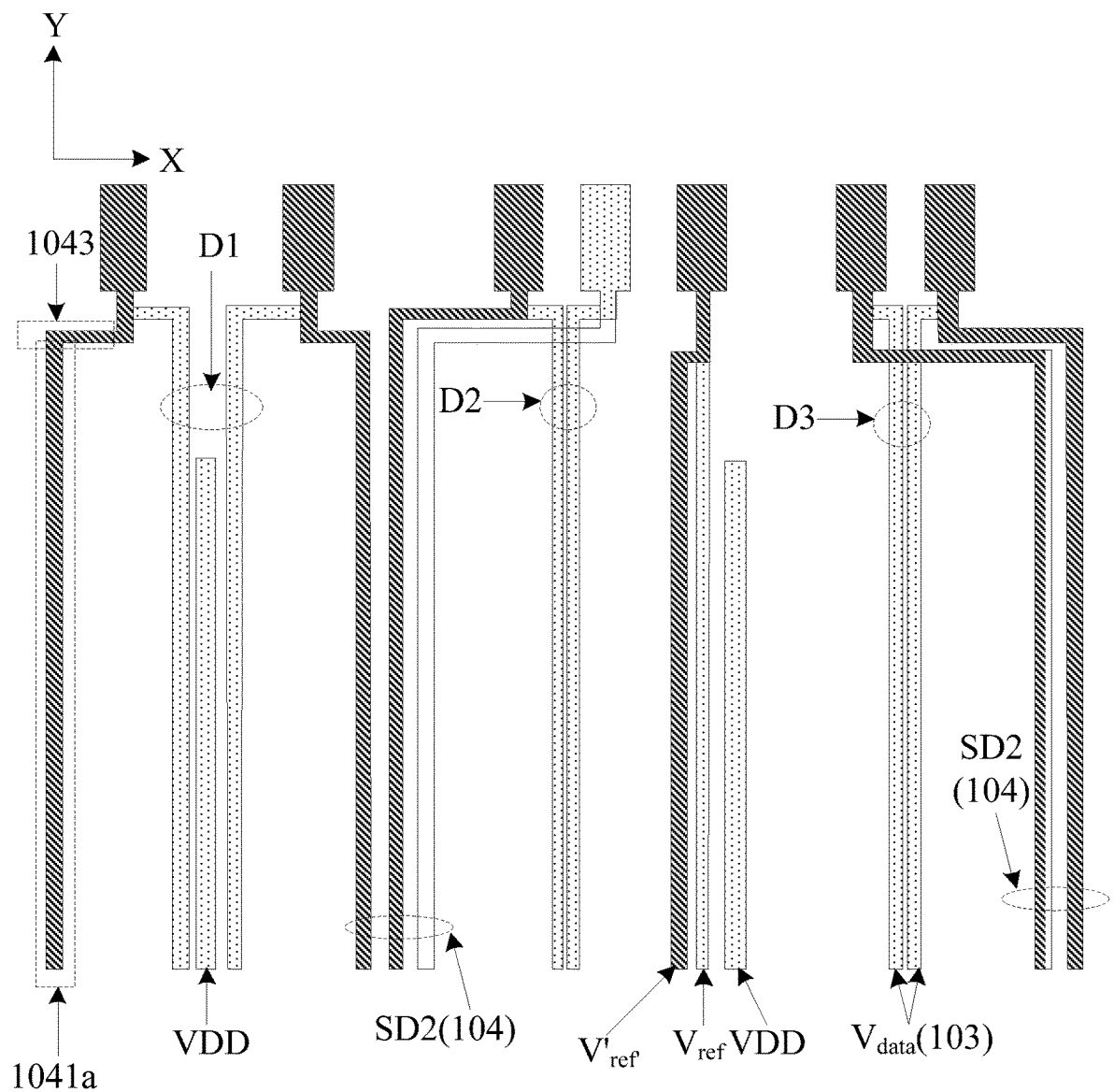
FIG. 4 is a line schematic diagram of data lines and lead lines provided by an embodiment of the present disclosure.

As for the technical problem existing in the related art, embodiments of the present disclosure provide a display substrate, as shown in FIG. 2 to FIG. 4, which includes:
  a base substrate 101, including a display area AA, and a bonding area BA disposed on one side of the display area AA;
  a plurality of gate lines 102, extending in the display area AA in a first direction and arranged in a second direction Y, wherein the first direction X and the second direction Y are arranged in an intersecting mode;
  a plurality of data lines 103, arranged in a different layer with the plurality of gate lines 102, and extending in the display area AA in the second direction Y and arranged in the first direction X; and
  a plurality of lead lines 104, arranged in a different layer with the plurality of gate lines (GL) 102 and the plurality of data lines 103, and extending to the bonding area BA from the display area AA in the second direction Y, each of the plurality of lead lines 104 is respectively electrically connected with each of the plurality of data lines 103, each lead line 104 includes a first portion 1041 extending in the second direction Y, and orthographic projections of at least part of the first portions 1041 on the base substrate 101 do not overlap with orthographic projections of the data lines 103 on the base substrate 101. In some embodiments, orthographic projections of all of the first portions 1041 on the base substrate 101 and orthographic projections of the data lines 103 do not overlap.

It can be seen from FIG. 1 to FIG. 3, in the display substrate provided by embodiments of the present disclosure, a layer of lead lines 104 providing gray-scale signals for the data lines 103 is individually arranged, and the lead lines 104 are designed to extend into the bonding area BA from the display area AA in the second direction Y, so that only the bonding area BA on a lower side of a periphery of the display area AA have the lead lines 104, and fan-out lines distributed in a fan-shaped mode in a related art are distributed in fan-out areas FA on a left side, a right and a lower side of the periphery of the display area AA. It can be seen by comparison, in a line scheme of the lead lines 104 provided by the present disclosure, a left frame and a right frame can be canceled, and the bonding area BA (namely a distance from a lower end of the display area AA to a source electrode driving chip) is very small, so that a frame of the display substrate is effectively reduced, and has a high screen-to-body ratio.

In addition, the data lines 103 and the lead lines 104 are both lines configured to transmit the gray-scale signals. While the gray-scale signals provided on the data lines 103 and the lead lines 104 are different, resistors and capacitors on the data lines 103 and the lead lines 104 may both affect normal transmitting of the gray-scale signals of the data lines 103 and the lead lines 104, that is, a RC delay problem of the gray-scale signals is caused, which even results in transmitting distortion of the gray-scale signals. By arranging that the orthographic projections of the first portions 1041 contained in the lead lines 104 on the base substrate 101 and orthographic projections of the data lines 103 do not overlap, parallel overlapping of the data lines 103 and the first portions 1041 contained in the lead lines 104 can be completely avoided, so that coupling capacitors between the data lines 103 and the lead lines 104 are avoided, and a problem that the gray-scale signals on the data lines 103 and the lead lines 104 are in mutual interference is solved.

It should be illustrated that the display area AA in the present disclosure may be a conventional display area AA in a right-angle rectangle shape, a rounded-rectangle shape, etc., which is not specifically limited herein. All the followings are illustrated by taking the display area AA as a special-shaped display area AA, moreover, when a shape of the special-shaped display area AA is constituted by a continuous arc (like a circle, an oval, a heart, etc.), one side of the special-shaped display area AA may specifically refer to a side of a middle area contained in the special-shaped display area AA and extending in the second direction; when the shape of the special-shaped display area AA is constituted by a plurality of line segments (like a polygon, etc.), one side of the special-shaped display area may specifically refer to a side where the line segment contained in the special-shaped display area AA and roughly perpendicular to the second direction Y.

In some embodiments, as shown in FIG. 2 and FIG. 3, the plurality of lead lines 104 may be symmetrically arranged with respect to a center axis MN of the special-shaped display area AA in the second direction Y, which may enable line lengths of all of the lead lines 104 to be equal, that is, resistance values of all of the lead lines 104 are almost the same, so that it is guaranteed that an efficiency of transmitting the gray-scale signals of each lead line 104 is the same, and a display effect is improved.

In some embodiments, as shown in FIG. 2 and FIG. 3, the lead lines 104 adjacent to the center axis MN of the special-shaped display area AA in the second direction Y include first portions 1041; the lead lines 104 away from the center axis MN of the special-shaped display area AA in the second direction Y may include: first portions 1041, and second portions 1042 extending in the middle area of the special-shaped display area AA in the first direction X, wherein orthographic projections of at least part of the second portions 1042 on the base substrate 101 do not overlap with orthographic projections of the gate lines 102. In some embodiments, the orthographic projections of all of the second portions 1042 on the base substrate 101 and the orthographic projections of the gate lines 102 do not overlap.

By arranging that the lead lines 104 adjacent to the center axis MN of the special-shaped display area AA in the second direction Y only include the first portions extending in the second direction Y, the lead lines 104 adjacent to the center axis MN of the special-shaped display area AA in the second direction Y may directly extend to the bonding area BA on one side of the special-shaped display area AA. Moreover, by arranging that the lead lines 104 away from the center axis MN of the special-shaped display area AA in the second direction Y are constituted of the second portions 1042 extending in the first direction X, and first portions 1041 extending in the second direction Y, the lead lines 104 away from the center axis MN of the special-shaped display area AA in the second direction Y may extend to the bonding area BA on one side of the special-shaped display area AA in the second direction Y after being wired in a bending mode in the special-shaped display area AA. Based on this, it is effectively guaranteed that the frame where the bonding area BA is located is narrow.

In addition, by arranging that the orthographic projections of the second portions 1042 on the base substrate 101 do not overlap with the orthographic projections of the gate lines 102, a parasitic capacitance between the lead lines 104 and the gate lines 102 is effectively reduced, and mutual interference of the gray-scale signals on the lead lines 104 and scanning signals on the gate lines 102 is avoided.

Figure 5:
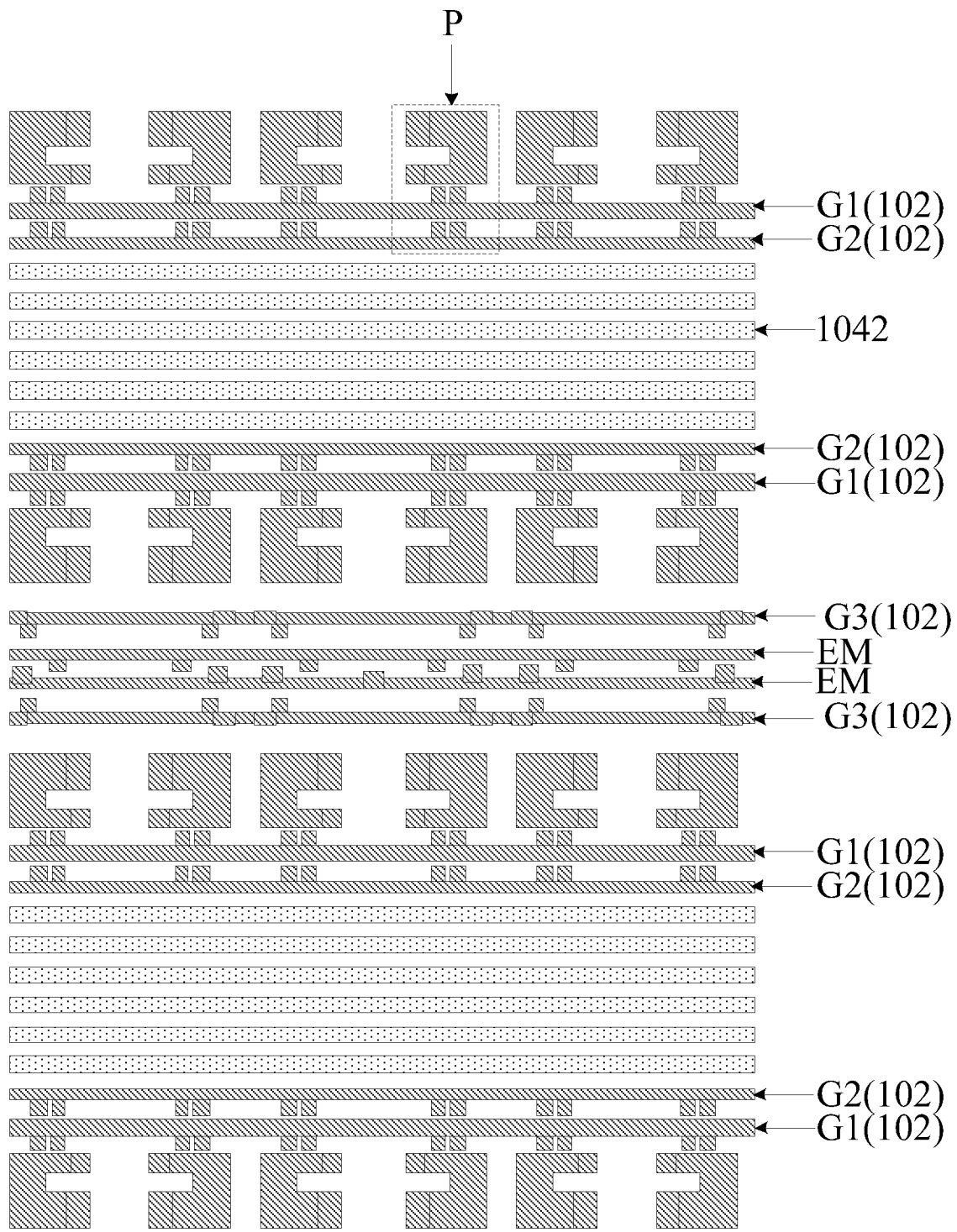
FIG. 5 is a line schematic diagram of gate lines provided by an embodiment of the present disclosure.

In some embodiments, as shown in FIG. 5, the display substrate further includes: a plurality of pixel units P distributed in an arrayed mode. Each pixel unit P may include a pixel driving circuit, and a light-emitting device EL electrically connected with the pixel driving circuit, wherein the pixel driving circuit may include transistors T1-T5 and a storage capacitor Cst in FIG. 6. In some embodiments, two pixel driving circuits adjacent up and down may share one fourth switching transistor T4, so as to enable the two pixel driving circuits adjacent up and down to constitute a 9T2C circuit including nine transistors and two capacitors. For convenient manufacturing, a first distance between two adjacent second portions 1042 may be arranged to be equivalent in any line gap of the pixel units P.

In some embodiments, as shown in FIG. 5, a plurality of second portions 1042 may be arranged in the line gap of two adjacent line pixel units P, at the moment, the first distance between the adjacent two second portions 1042 may evenly divide the line gap of two adjacent lines of the pixel units P into n parts, wherein n is a total number of the second portions 1042 arranged at the line gap of the two adjacent lines of pixel units P. Certainly, in the case of a low resolution ratio of the display device, the first distance between the adjacent second portions 1042 may further be greater than or equal to the line gap of two adjacent lines of the pixel units P, as shown in FIG. 3.

In some embodiments, in order to guarantee that intersecting and short circuiting do not occur to all of the lead lines 104, as shown in FIG. 2 and FIG. 3, it may be arranged that the lengths of all of the second portions 1042 which are successively arrayed in a direction pointing to the bonding area BA from the special-shaped display area AA are gradually increasing.

In other words, the closer the second portions 1042 to the bonding area BA are, the longer the second portions 1042 are. Moreover, in consideration that the lead lines 104 having the second portions 1042 are far away from the center axis MN of the special-shaped display area AA in the second direction Y, in the present disclosure, in order to guarantee that the second portions 1042 are located in the special-shaped display area AA, the maximum length of the second portions 1042 needs to be smaller than ½ of the maximum width of the special-shaped display area AA in the first direction X.

In some embodiments, as shown in FIG. 2 and FIG. 3, each lead line 104 further may include: a third portion 1043 extending in a edge area of the special-shaped area AA in the first direction X. Orthographic projections of the third portions 1043 on the base substrate 101 do not overlap with the orthographic projections of the gate lines 102, and the third portions 1043 are electrically connected with the corresponding data lines 103.

By arranging the third portions 1043 extending in the first direction X on the edge area of the special-shaped display area AA, it may be guaranteed that wiring of the third portions 1043 is short. Moreover, by arranging the orthographic projections of the third portions 1043 on the base substrate 101 do not overlap with the orthographic projections of the gate lines 102, a parasitic capacitance between the lead lines 104 and the gate lines 102 is effectively lowered, and mutual interference of the gray-scale signals on the lead lines 104 and the scanning signals on the gate lines 102 is avoided.

In some embodiments, as shown in FIG. 2 and FIG. 3, the first portions 1041 of the lead lines 104 away from the center axis MN of the special-shaped display area AA in the second direction Y include: first sub-portions 1041a and second sub-portions 1041b, wherein first ends of the first sub-portions 1041a are electrically connected with the third portions 1043, second ends of the first sub-portions 1041a are electrically connected with first ends of the second portions 1042 adjacent to the boundary of the special-shaped display area AA; first ends of the second sub-portions 1041b are electrically connected with second ends of the second portions 1042 away from the boundary of the display area, and second ends of the second sub-portions 1041b are located in the bonding area BA; in the first direction X, the maximum distance between all of the first sub-portions is greater than the maximum distance between all of the second sub-portions.

By being arranged in the first direction X, the maximum distance between all of the first sub-portions is greater than the maximum distance between all of the second sub-portions, it is equivalent to that shrinkage wiring is performed on the lead lines 104 near the bonding area BA, so that when the whole lead lines 104 are connected with the external source electrode driving chips, only a small frame (namely the bonding area BA) on the display substrate may be occupied.

In some embodiments, every two adjacent data lines 103 are in one data line set, every three adjacent data line sets are in a cycle period (FIG. 4 illustrates a cycle period), the three data line sets in one cycle period are a first data line set D1, a second data line set D2 and a third data line set D3 successively arrayed in the first direction X. In order to realize nearby wiring of the lead lines 104 and the corresponding data lines 103, as shown in FIG. 4, two first sub-portions 1041a corresponding electrically connected with two data lines 103 in the first data line set D1 may be arranged to be located on two sides of the first data line set D1, two first sub-portions 1041a correspondingly electrically connected with the two data lines 103 in the second data line set D2 are located at a gap of the first data line set D1 and the second data line set D2, and two first sub-portions 1041a correspondingly electrically connected with the two data lines 103 in the third data line set D3 are located on a side of the third data line set D3 away from the second data line set D2.

In some embodiments, in the gap between two adjacent data line sets, distances between three first sub-portions 1041a are the same as shown in FIG. 4. In addition, a high-level power line VDD is arranged between two data lines 103 contained in the first data line set D1, and a high-level power line VDD and a reference signal line $V_{ref}$ are arranged at a gap of the second data line set D2 and the third data line set D3. Optionally, the high-level power line VDD, the reference signal line $V_{ref}$ and the data lines 103 are arranged in the same layer, and a line $V'_{ref}$ in the same layer with the lead lines 104 may be further arranged to be electrically connected with the reference signal line $V_{ref}$.

In some embodiments, as shown in FIG. 2 and FIG. 3, the larger the distance between the first sub-portions 1041a and the center axis MN of the display area AA in the second direction Y is, the shorter the first sub-portions 1041a are. This arrangement may enable the lengths of all of the lead lines 104 to be roughly the same, and it is beneficial to guarantee the same frequency of the different lead lines 104 for transmitting the gray-scale signals, and improve a display effect.

In some embodiments, as shown in FIG. 2 and FIG. 3, one ends of the lead lines 104 away from the bonding area BA are electrically connected with the ends of the corresponding data lines 103 away the bonding area BA.

The lead lines 104 go out from the bonding area BA, then pass through the special-shaped display area AA to reach top ends of every column of data lines 103, and are connected to the data lines 103 in the special-shaped display area AA in a layer-switching mode at the top ends, so that it can be guaranteed that the lead lines 104 do not intersect, and also can be guaranteed that a driving sequence is not changed.

Figure 6:
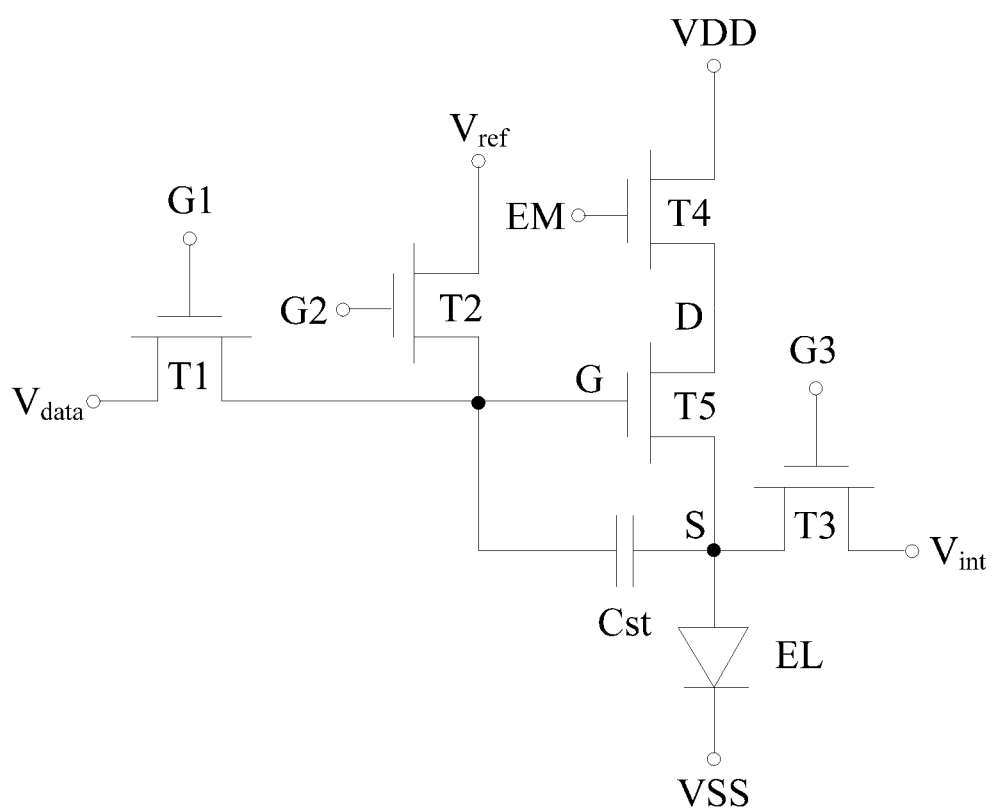
FIG. 6 is a structural schematic diagram of pixel driving circuits provided by an embodiment of the present disclosure.
Figure 7:
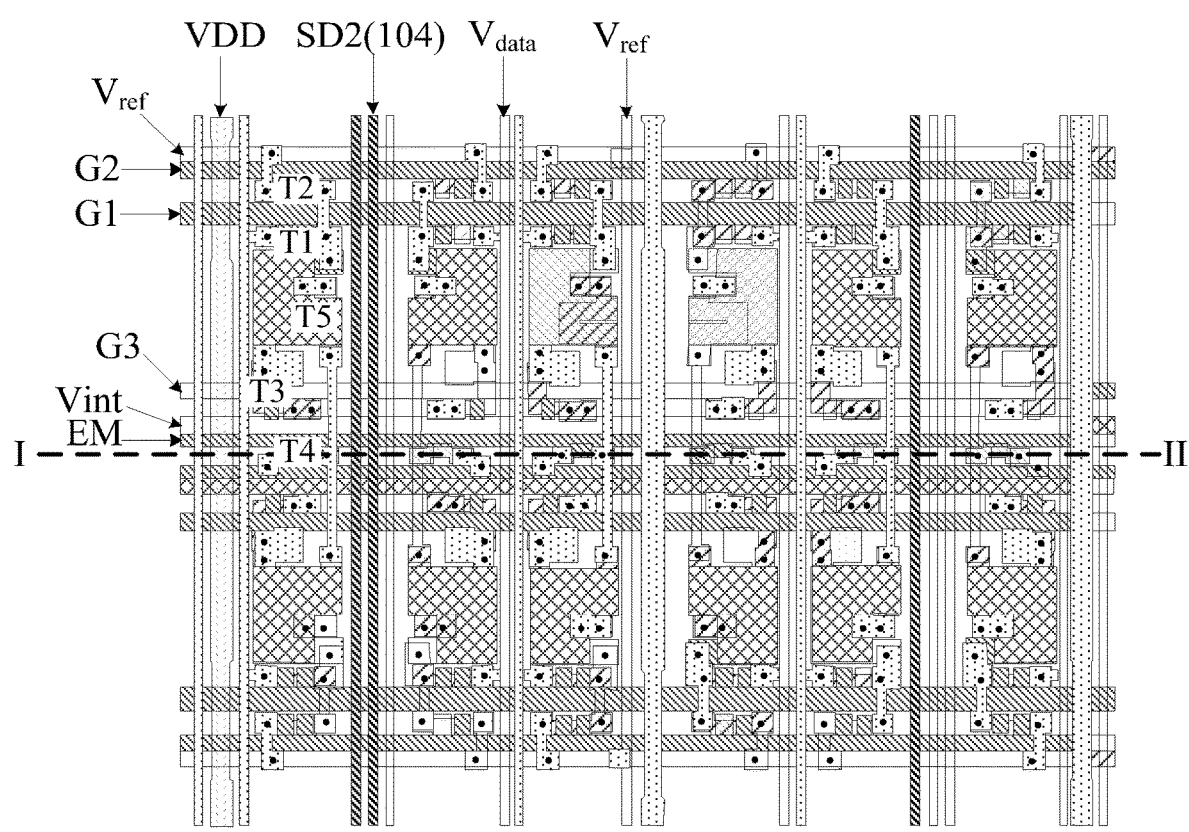
FIG. 7 is a layout diagram of the pixel driving circuits as shown in FIG. 6.

In some embodiments, as shown in FIG. 6, may further include a plurality of pixel driving circuits located in an area defined by the plurality of gate lines 102 and the plurality of data lines 103, each pixel driving circuit may include: a first switching transistor T1, a second switching transistor T2, a third switching transistor T3, a light-emitting control transistor T4, a driving transistor T5 and a storage capacitor Cst, wherein as shown in FIG. 6 and FIG. 7, a gate electrode of the first switching transistor T1 is electrically connected with a first gate line G1, a drain electrode of the first switching transistor T1 and the data lines 103 providing gray-scale signals Vdata are electrically connected, a source electrode of the first switching transistor T1 is electrically connected with a source electrode of the second switching transistor T2, a gate electrode of the driving transistor T5, and a first electrode of the storage capacitor Cst, a gate electrode of the second switching transistor T2 is electrically connected with a second gate line G2, a drain electrode of the second switching transistor T2 is electrically connected with the reference signal line $V_{ref}$, a gate electrode of the third switching transistor T3 is electrically connected with a third gate line G3, a drain electrode of the third switching transistor T3 is electrically connected with an initial signal line $V_{int}$, a source electrode of the third switching transistor T3 is electrically connected with an anode of a light-emitting device EL and a source electrode of the driving transistor T5, a gate electrode of the fourth switching transistor T4 is electrically connected with the light-emitting control signal line EM, a drain electrode of the fourth switching transistor T4 is electrically connected with the high-level power line VDD, and a source electrode of the fourth switching transistor T4 is electrically connected with a drain electrode of the driving transistor T5. Moreover, as shown in FIG. 7, two pixel driving circuits adjacent up and down share one fourth switching transistor T4, and are symmetrically arranged with respective to an I-II line, so as to constitute a 9T2C circuit including nine transistors and two capacitors.

Figure 8:
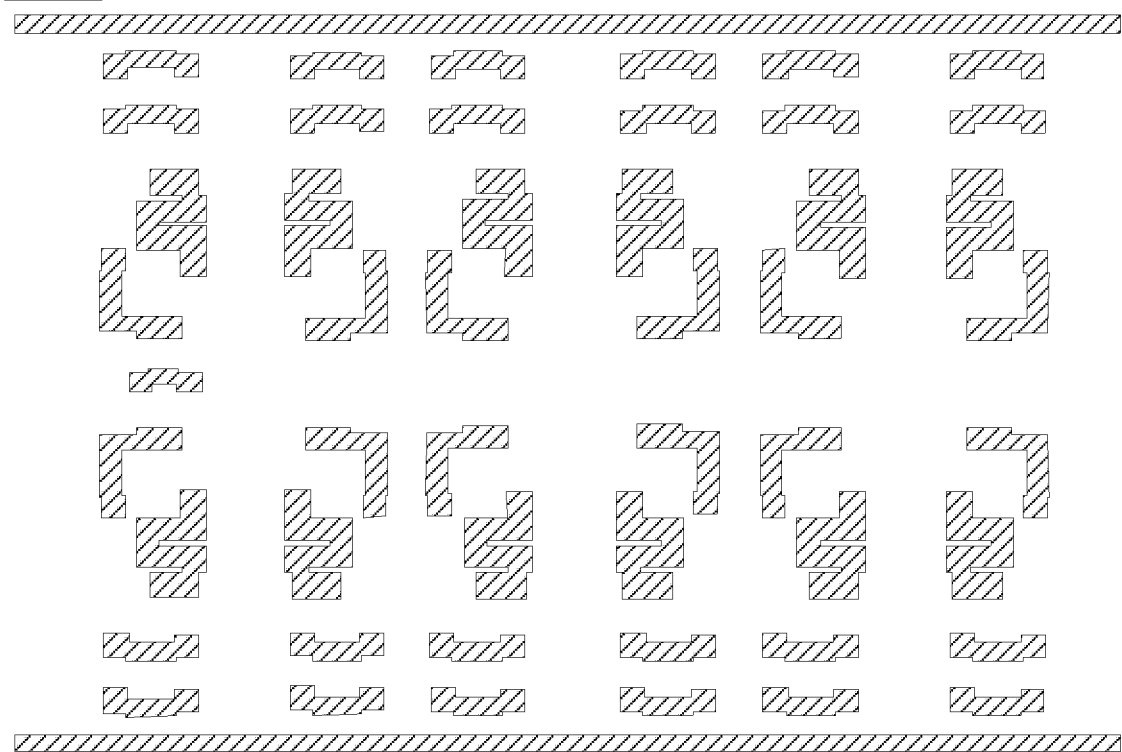
FIG. 8 is a layout diagram of an active layer in the pixel driving circuits shown in FIG. 7.
Figure 9:
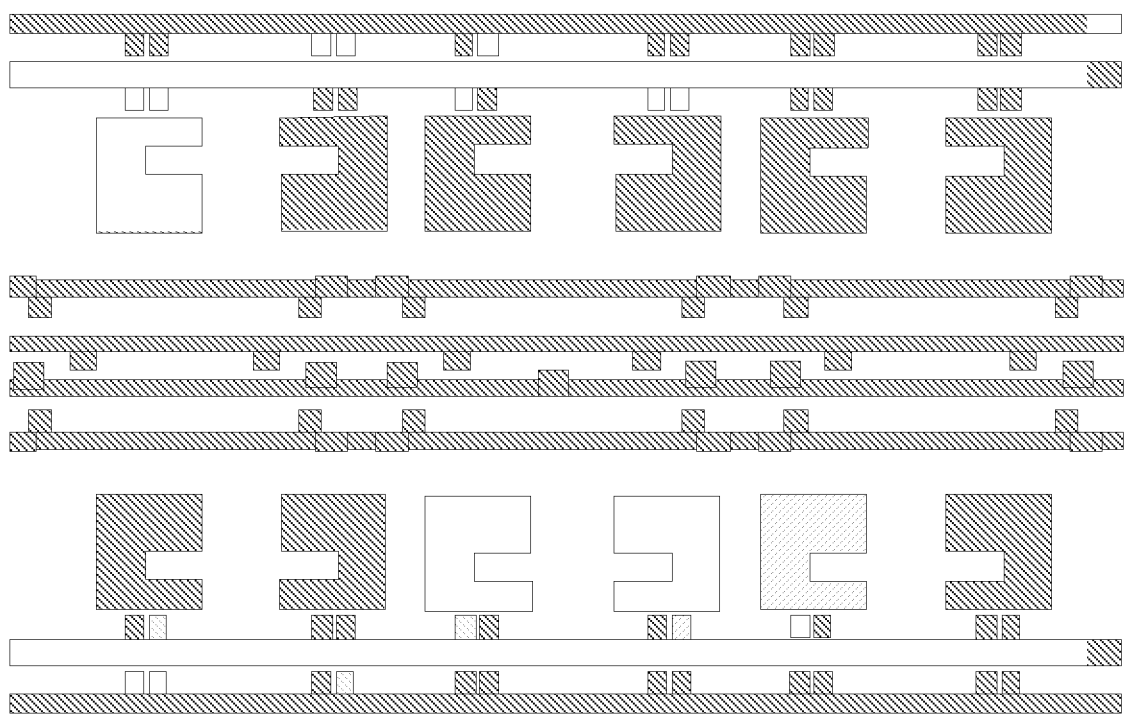
FIG. 9 is a layout diagram of a first gate metal layer in the pixel driving circuits as shown in FIG. 7.
Figure 10:
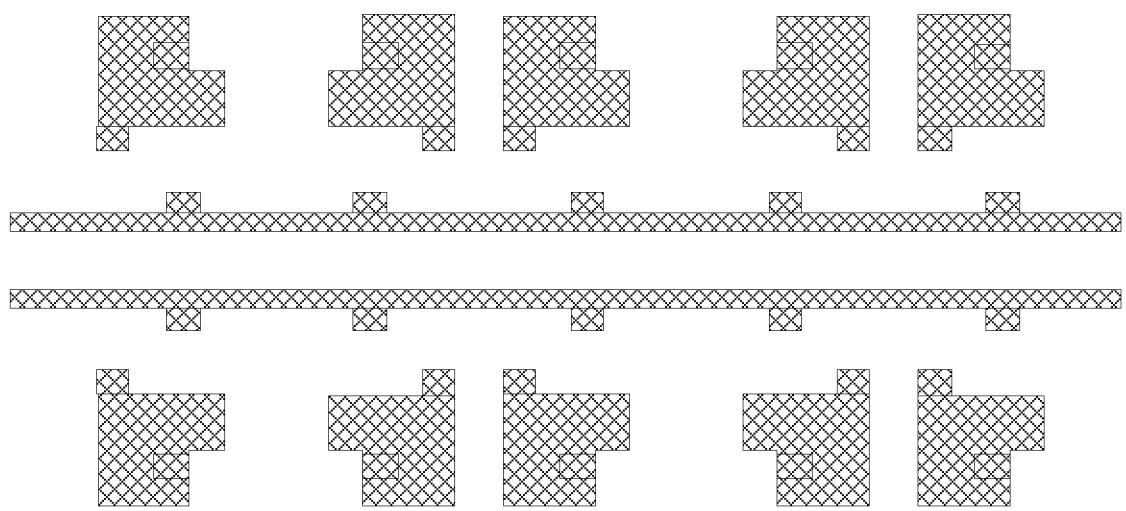
FIG. 10 is a layout diagram of a second gate metal layer in the pixel driving circuits as shown in FIG. 7.
Figure 11:
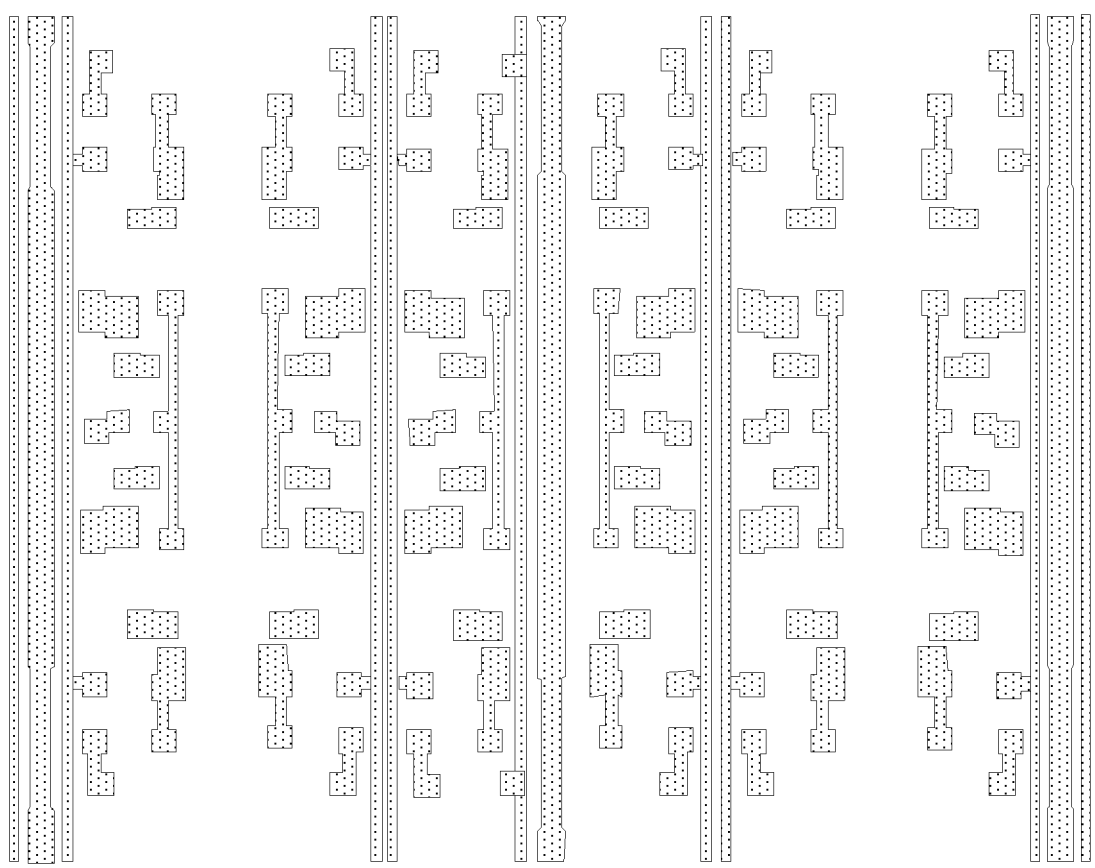
FIG. 11 is a layout diagram of a first source drain metal layer in the pixel driving circuits as shown in FIG. 7.
Figure 12:
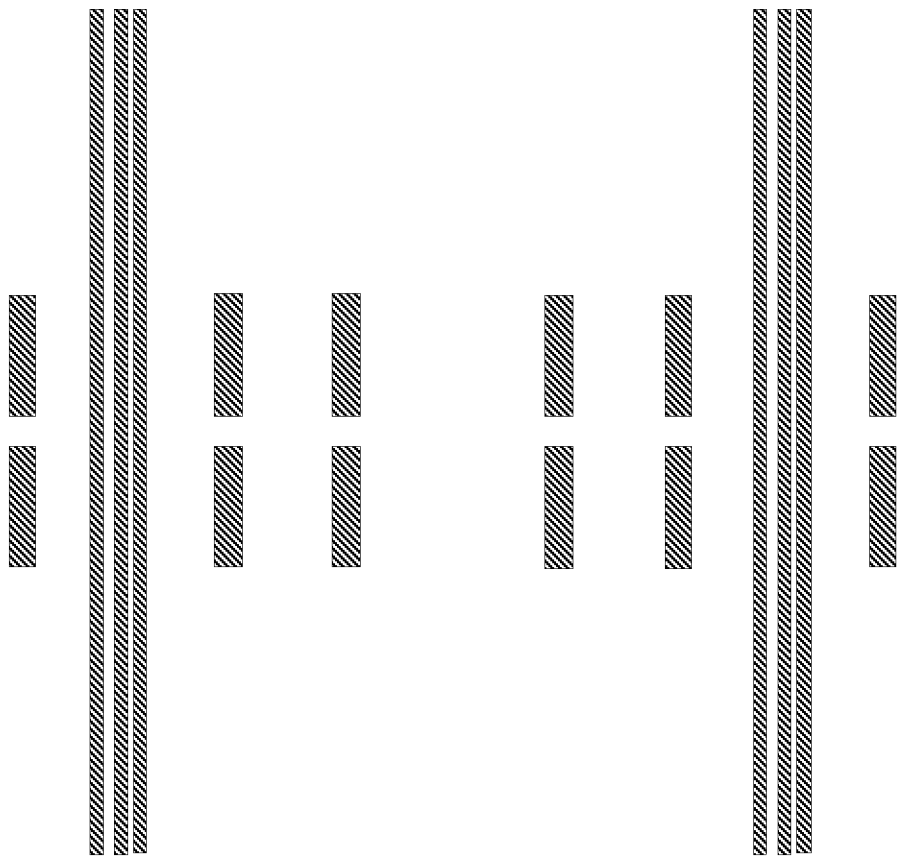
FIG. 12 is a layout diagram of a second source drain metal layer in the pixel driving circuits as shown in FIG. 7.

In addition, a film layer as shown in FIG. 8 is the layer where active layers (Poly) of all of the transistors are placed, a film layer as shown in FIG. 9 is a first gate metal layer (Gate1) where gate electrodes of all of the transistors and the first electrode of the storage capacitor Cst are placed, a film layer as shown in FIG. 10 is a second gate metal layer (Gate2) where a second electrode of the storage capacitor Cst is placed, a film layer as shown in FIG. 11 is a first source drain metal layer (SD1) where source electrodes and drain electrodes of all of the transistors are placed, and a film layer as shown in FIG. 12 is a second source drain metal layer (SD2) where the lead lines 104 are placed.

Figure 13:
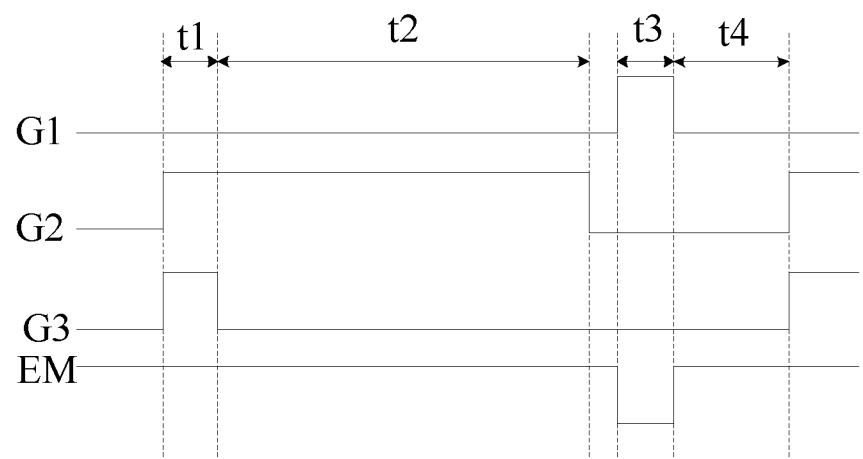
FIG. 13 is a working time sequence diagram of the pixel driving circuits as shown in FIG. 7.

During some implementations, as shown in FIG. 13, in a restoration stage t1, the first gate line G1 outputs a low level, the second gate line G2 outputs a high level, the third gate line G3 outputs a high level, and the light-emitting control signal line EM outputs a high level. The first switching transistor T1 is in a cut-off state under control of the low level of the first gate line G1. The second switching transistor T2 is switched on under control of the high level the second gate line G2, and the reference signal line $V_{ref}$ reconfigures the gate electrode of the driving transistor T5 through the switched-on second switching transistor T2. The third switching transistor T3 is switched on under control of the high level of the third gate line G3, and the initial signal line $V_{int}$ reconfigures the source electrode of the driving transistor T5 through the switched-on third switching transistor T3. The fourth switching transistor T4 is switched on under control of the light-emitting signal line EM, and the high-level power line VDD reconfigures the drain electrode of the driving transistor T5 through the switched-on fourth switching transistor T4.

In a compensation stage t2, as shown in FIG. 13, the second gate line G2 and the light-emitting control signal line EM are maintained to output high levels, the first gate line G1 is maintained to output a low level, and the third gate line G3 outputs a low level. The first switching transistor T1 is in a cut-off state under control of the low level of the first gate line G1. The third switching transistor T3 is in a cut-off state under control of the low level of the third gate line G3. The second switching transistor is switched on under control of the high level of the second gate line G2, continuously outputs signals of the reference signal line $V_{ref}$ to the gate electrode of the driving transistor T5, and maintains a gate potential of the driving transistor T5. The fourth switching transistor T4 outputs signals of the high-level power line VDD to the drain electrode of the driving transistor T5 under control of the high level of the light-emitting control signal line EM, and the drain electrode and the source electrode of the driving transistor T5 are conducting to perform threshold compensation of the gate electrode of the driving transistor T5.

In a data writing stage t3, as shown in FIG. 13, the first gate line G1 outputs a high level, the second gate line G2 outputs a low level, the third gate line G3 outputs a low level, and the light-emitting control signal line EM outputs a low level. The first switching transistor T1 is switched on under control of the high level of the first gate line G1, gray-scale signals Vdata of the data lines 103 are written into the gate electrode of the driving transistor T5, and a source potential of the driving transistor T5 is changed due to a coupling effect of the storage capacitor Cst. The second switching transistor T2, the third switching transistor T3 and the fourth switching transistor T4 are in a cut-off state under control of the corresponding low levels.

In a light-emitting stage t4, as shown in FIG. 13, the first gate line G1, the second gate line G2 and the third gate line G3 output low levels, the light-emitting control signal line EM outputs a high level. The first switching transistor T1 is in a cut-off state under control of the low level of the first gate line G1, the second switching transistor T2 is in a cut-off state under control of the low level of the second gate line G2, and the third switching transistor T3 is in a cut-off state under control of the low level of the third gate line G3. The fourth switching transistor T4 is switched on under control of the high level of the light-emitting control signal line. Signals of the high-level power line VDD are written into the drain electrode of the driving transistor T5 through the switched-on fourth switching transistor T4, and the drain electrode and the source electrode of the driving transistor T5 are switched on, so that the light-emitting device EL emits light according to a source potential of the driving transistor T5 and a potential of a low-level power line VSS.

A polycrystalline silicon material has a high mobility, low energy consumption and a high reliability, so that in some embodiments, the driving transistor T5 may be a low-temperature polycrystalline silicon thin film transistor. A band gap of an oxide semiconductor material is larger than that of a silicon material, so that an electron cannot go through the band gap in an off state and cut off a low current. Accordingly, an oxide thin film transistor is suitable for the first switching transistor T1 to the fourth switching transistor T4 which are maintained to be switched on in a short time and switched off in a long time. In addition, because a cut-off current of the first switching transistor T1 is low, a size of the storage capacitor Cst can be properly reduced.

It should be noted that, the technical scheme provided by the present disclosure only takes the pixel driving circuit of the 5T1C shown in FIG. 6 for explanation. During specific implementations, the technical scheme provided by the embodiment of the present disclosure is also suitable for pixel driving circuits of other structures known by the skill in the art, which is not limited herein.

Figure 14:
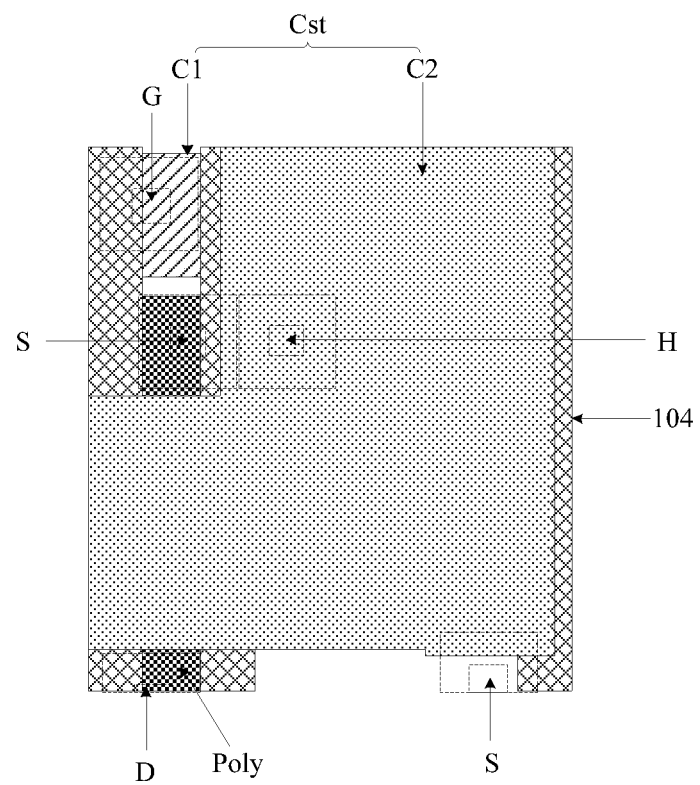
FIG. 14 is a relation diagram of a relative position of a gate electrode of a driving transistor and a storage capacitor in the pixel driving circuits and lead lines provided by an embodiment of the present disclosure.

Due to the fact that the lead lines 104 are guide lines in which high-frequency gray-scale signals run, the gray-scale signals thereon continuously jump, in order to guarantee that the lead lines 104 do not interfere normal working of the light-emitting device EL, the gate line G of the driving transistor T5 having a floating state needs to avoid the lead lines 104 as far as possible. Accordingly, in some embodiments, as shown in FIG. 7, it may be arranged that the lead lines 104 located on the second source drain metal layer (SD2) do not overlap with all of the transistors, particularly, the orthographic projections of the lead lines 104 on the base substrate 101 do not overlap with an orthographic projection of the gate electrode G of the driving transistor T5 on the base substrate 101. In other embodiments, as shown in FIG. 14, the orthographic projections of at least part of the lead lines 104 on the base substrate 101 may overlap with the orthographic projection of the gate electrode G of the driving transistor T5, at the moment a second electrode C2 located between the layer where the lead lines 104 are placed and the layer where the gate electrode G of the driving transistor T5 is placed may be made big, so as to cover the most area of the gate electrode G of the driving transistor T5, so that the intersecting lead lines 104 are isolated from the gate electrode G of the driving transistor T5 through the second electrode C2, and the high-frequency gray-scale signals on the lead lines 104 are prevented from affecting the potential of the gate electrode G of the driving transistor T5. Moreover, the second electrode C2 is reused as a shielding layer between the lead lines 104 and the gate electrode G of the driving transistor T5, a shielding layer does not need to be additionally arranged, which reduces a quantity of film layers, is beneficial to lightweight design, improves a manufacturing efficiency and lowers a production cost. In addition, the first electrode C1 of the storage capacitor Cst may be reused as the gate electrode G of the driving transistor T5, so that the first electrode C1 and the second electrode C2 covering the most area of the gate electrode G of the driving transistor T5 mutually overlap to constitute the storage capacitor Cst.

In some embodiments, in order to guarantee a display effect, a ratio of an overlapping area, of the orthographic projections of the plurality of lead lines 104 on the base substrate 101 and the orthographic projections of the gate electrode G of the driving transistor T5 on the base substrate 101, to an area of the gate electrode G of the driving transistor T5 is less than ⅓.

Figure 15:
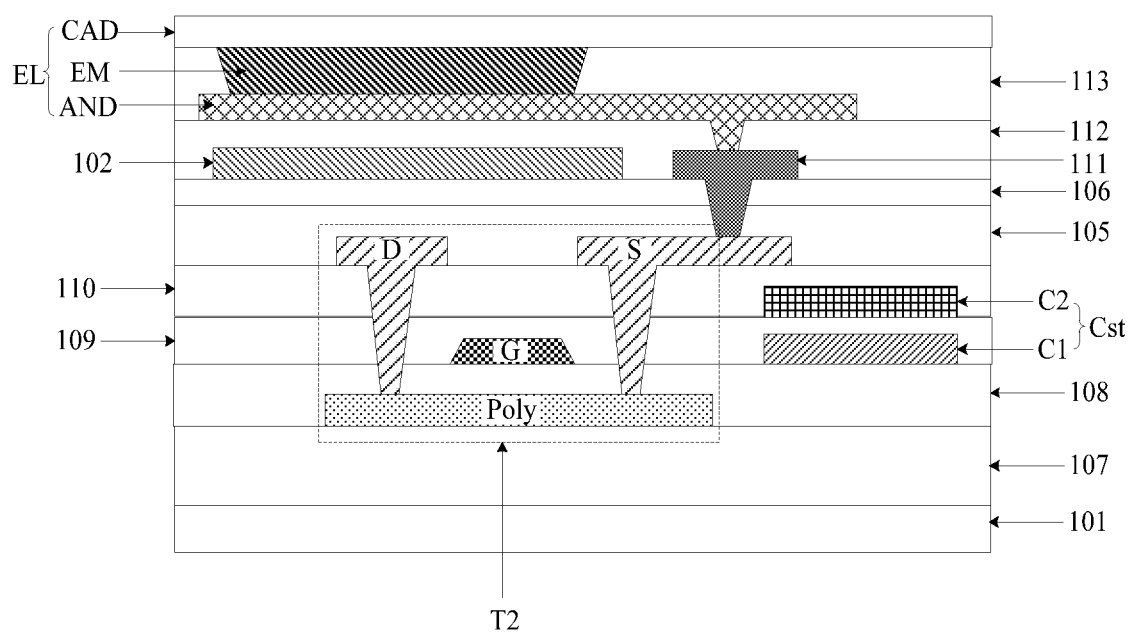
FIG. 15 is yet another structural schematic diagram of a display substrate provided by an embodiment of the present disclosure.

In some embodiments, as shown in FIG. 15, the display substrate may further include: an organic insulating layer 105 located between a layer where the plurality of data lines 103 (not shown in the drawings) are located and a layer where the plurality of lead lines 104 are located; each lead line 104 is electrically connected with the corresponding data line 103 through a first via hole penetrating through the organic insulating layer 105.

By arranging the organic insulating layer 105 between the layer where the plurality of data lines 103 (not shown in the drawings) are located and the layer where the plurality of lead lines 104 are located, thus parasitic capacitors between all film layers of the plurality of lead lines 104 and the pixel driving circuits can be greatly reduced. In some embodiments, a thickness of the organic insulating layer 105 may be about 2 μm.

In some embodiments, as shown in FIG. 15, the display substrate may further include: an inorganic insulating layer 106 between the organic insulating layer 105 and the layer where the plurality of lead lines 104 are located; at the moment, each lead line 104 may be electrically connected with the corresponding data line 103 through a second via hole penetrating through the inorganic insulating layer 106, and the first via hole and the second via hole corresponding to each lead line 104 are arranged in a penetrating mode.

Since when the lead lines 104 are formed by a sputtering process, the organic insulating layer 105 may be caused to be partially stripped so as to pollute a cavity, the inorganic insulating layer 106 is added on the organic insulating layer 105, so that the organic insulating layer 105 may be protected through the inorganic insulating layer 106, and it may be avoided that the organic insulating layer 105 is exposed to pollute a cavity when the lead lines 104 are disposed in following sputtering.

In some embodiments, as shown in FIG. 2, FIG. 3 and FIG. 15, the display substrate may further include a plurality of light-emitting devices EL located on one sides of the plurality of lead lines 104 (arranged in the same layer as adapter electrodes 111) deviating from one side of the base substrate 101; the plurality of light-emitting devices EL constitute a plurality of light-emitting device columns extending in the second direction Y, and the larger a distance between the light-emitting device columns and the center axis MN of the special-shaped display area AA in the second direction Y is, the smaller of a quantity of the light-emitting devices EL contained in the light-emitting device columns is. All of the light-emitting devices El arranged in this way together constitute a display product having the oval special-shaped area AA.

In some embodiments, as shown in FIG. 15, the light-emitting devices EL include anodes AND, light-emitting function layers EM and cathodes CAD, wherein the light-emitting function layers EM may include hole injection layers, hole transporting layers, electron barrier layers, light-emitting material layers, hole barrier layers, electron transporting layer and electron injection layers; the light-emitting material layers on areas where different anodes AND are located may be arranged in a disconnected mode, so as to realize light emitting of different colors (like red, green and blue); certainly, the light-emitting layers on areas where the different anodes AND are located may also be integrally arranged, so as to realize light emitting of a single color (like white). In addition, whether every layer in the hole injection layers, the hole transporting layers, the electron barrier layers, the hole barrier layers, the electron transporting layers and the electron injection layers is disconnected or not, it should be designed according to a light-emitting efficiency and the like needed by the light-emitting devices EL of different colors, which is not limited herein.

In some embodiments, as shown in FIG. 15, the display substrate provided by the present disclosure may further include: a buffer layer 107, a first gate insulating layer 108, a second gate insulating layer 109, an interlayer dielectric layer 110, an adapter electrode 111, a flat layer 112, a pixel defining layer 113, etc., wherein the adapter electrode 111 and the lead lines 104 are arranged in the same layer. Other necessary constituent parts (like a packaging layer) of the display substrate should be all understood to exist by those of ordinary skill in the art, which is not repeated herein, and should not be limited to the present disclosure.

What need illustration is that in the present disclosure, "same layer" means a layer structure formed by adopting a same film forming process to form a film layer configured to manufacture a specific pattern and then utilizing the same mask plate through a one-time layout process That is, the one-time layout process corresponds to one mask plate (also named as a light shield). According to different specific patterns, the one-time layout process may include multi-exposure, display or etching processes, the specific patterns in the formed film structure may also be continuous or also discontinuous, and these specific patterns may also be at different heights or have different thicknesses.

Based on the same inventive concept, embodiments of the present disclosure provide the display device, including the above display substrate provided by embodiments of the present disclosure. Other necessary constituent parts of the display device should be all understood to exist by the skill in the art, which is not repeated herein, and also should not be limited to the present disclosure.

In some embodiments, the display device may be a mobile phone, a flat computer, a television, a displayer, a notebook computer, a digital photo frame, a navigator, a smart watch, a fitness bracelet, a personal digital assistant and any other products or components having a display function.

In addition, it should be understood that since a principle for solving problems of the display device is similar to a principle for solving problems of the above display substrate, so that the implementations of the display device may refer to the embodiments of the above display substrate, which is not repeated.

In some embodiments, the display device may also include: a source electrode driving chip, the source electrode driving chip includes a plurality of signal channels; the plurality of signal channels are electrically connected with the plurality of lead lines 104 in a one-to-one correspondence mode on the bonding area BA, and a total width of the plurality of lead lines 104 on the bonding area BA in the first direction X is equivalent with a total width of the plurality of signal channels.

This arrangement may enable a sequence of the signal channels of the source electrode driving chip to be maintained the same as a sequence of signal channels of a source electrode driving chip in the related art, a structure of the source electrode driving chip does not need to be changed, so as to save a development and design cost of the source electrode driving chip. Moreover, the plurality of signal channels of the source electrode driving chip correspond to an arraying sequence of the data lines 103 in the special-shaped display area AA from left to right, that is, the first signal channel on a left side of the source electrode driving chip corresponds to a data line 103 of the first column of light-emitting device EL on a left side of the special-shaped display area AA, and the last signal channel on a right side of the source electrode driving chip corresponds to the data line 103 of the last column of light-emitting device EL on a right side of the special-shaped display area AA, so that a driving sequence of the source electrode driving chip to all columns of the light emitting devices EL is maintained unchanged.

In some embodiments, the source electrode driving chip may be located on a display side of the display device; in some other embodiments, the source electrode driving chip may be further folded to an opposite side of the display side (namely a back face of the display device), so that the source electrode driving chip does not occupy the frame of the display device, and a design requirement for a narrow frame is further met.

What needs illustration is that in the present disclosure, the total width of the plurality of lead lines 104 in the bonding area BA specifically refers to a sum of line widths of the plurality of lead lines 104 and gap widths of the plurality of lead lines 104 in the bonding area BA. The total width of the plurality of signal channels refers to a sum of widths of the plurality of signal channels and gap widths of the plurality of signal channels.

The display substrate and the display device provided by the present disclosure may realize a technical effect of an ultra-narrow frame, and include: a base substrate, which includes: a display area, and a bonding area located on one side of the display area; a plurality of gate lines, extending in a first direction and arrayed in a second direction in the display area, wherein the first direction and the second direction are arranged in an intersecting mode; a plurality of data lines, arranged in a different layer with the plurality of gate lines, and extending in the second direction and arrayed in the first direction in the display area; a plurality of lead lines, arranged in the different layer with the plurality of gate lines and the plurality of data lines, and extending to the bonding area from the display area in the second direction; each of the plurality of lead lines are respectively electrically connected with each of the plurality of data lines, each lead line include a first portion extending in the second direction, and orthographic projections of at least part of the first portions on the base substrate do not overlap with orthographic projections of the data lines.

Apparently, the skill in the art may make various modifications and variations to the embodiments of the present invention without deviating a spirit and scope of the embodiments of the present invention. Thus, if these modifications and variations of the embodiments of the present invention belong to the claims of the present invention and equivalent technical scopes thereof, the present invention also intends to include these modifications and variations.

What is claimed is:

1. A display substrate, comprising:
a base substrate, comprising: a display area, and a bonding area disposed on one side of the display area;
a plurality of gate lines, extending in a first direction and arranged in a second direction in the display area, wherein the first direction and the second direction are arranged in an intersecting mode;
a plurality of data lines, arranged in a different layer with the plurality of gate lines, and extending in the second direction and arranged in the first direction in the display area; and
a plurality of lead lines, arranged in a different layer with the plurality of gate lines and the plurality of data lines, and extending to the bonding area in the second direction from the display area;
wherein the plurality of lead lines each is electrically connected with a respective one of the plurality of data lines, each of the plurality of lead lines comprises a first portion extending in the second direction, and orthographic projections of at least part of the first portions on the base substrate do not overlap with orthographic projections of the data lines on the base substrate; and
at least part of the first portions is in the display area.

2. The display substrate according to claim 1, wherein, the plurality of lead lines are arranged symmetrically with respect to a center axis of the display area in the second direction.

3. The display substrate according to claim 2, wherein the plurality of lead lines away from the center axis of the display area in the second direction further comprise: second portions extending in the first direction in a middle area of the display area; and
orthographic projections of at least part of the second portions on the base substrate do not overlap with orthographic projections of the gate lines on the base substrate.

4. The display substrate according to claim 3, further comprising:
a plurality of pixel units distributed in an arrayed mode;
wherein, in a gap between two adjacent rows of pixel units extending in the first direction, a first distance between two adjacent second portions is equivalent.

5. The display substrate according to claim 3, wherein, lengths of the second portions arranged in sequence in a direction from the display area to the bonding area are gradually increasing.

6. The display substrate according to claim 3, wherein, each of the plurality of lead lines further comprises: a third portion extending in the first direction in an edge area of the display area;
orthographic projections of the third portion on the base substrate do not overlap with the orthographic projections of the gate lines on the base substrate; and
the third portion is electrically connected with the corresponding data line.

7. The display substrate according to claim 6, wherein, the first portions of the lead lines away from the center axis of the display area in the second direction comprise: first sub-portions and second sub-portions; wherein,
first ends of the first sub-portions are electrically connected with the third portions, and second ends of the first sub-portions are electrically connected with first ends of the second portions adjacent to a boundary of the display area;
first ends of the second sub-portions are electrically connected with second ends of the second portions away from the boundary of the display area, and second ends of the second sub-portions are located in the bonding area; and
in the first direction, a maximum distance between adjacent first sub-portions is greater than a maximum distance between adjacent second sub-portions.

8. The display substrate according to claim 7, wherein, every two adjacent data lines are in one data line set, every three adjacent data line sets are in a cycle period, the three data line sets in one cycle period are a first data line set, a second data line set and a third data line set; and
two first sub-portions electrically connected with two data lines in the first data line set are arranged on two sides of the first data line set;
two first sub-portions electrically connected with two data lines in the second data line set are arranged in a gap between the first data line set and the second data line set; and
two first sub-portions electrically connected with two data lines in the third data line set are arranged on one side of the third data line set away from the second data line set.

9. The display substrate according to claim 7, wherein, the larger a distance between the first sub-portions and the center axis of the display area in the second direction, the shorter lengths of the first sub-portions.

10. The display substrate according to the claim 1, wherein, one ends of the plurality of lead lines away from the bonding area are electrically connected with one ends of the plurality of data lines away from the bonding area.

11. The display substrate according to claim 1, further comprising: a plurality of pixel driving circuits located in an area defined by the plurality of gate lines and the plurality of data lines, wherein,
each of the plurality of pixel driving circuit comprises a driving transistor and a storage capacitor;
a first electrode of the storage capacitor is reused as a gate electrode of the driving transistor, a second electrode of the storage capacitor is arranged between a layer where the gate electrode of the driving transistor is located and a layer where the data lines are located; and
orthographic projections of at least part of the plurality of lead lines on the base substrate overlap with orthographic projections of the gate electrodes of the driving transistors on the base substrate.

12. The display substrate according to claim 11, wherein, a ratio of an overlapping area, of the orthographic projections of the plurality of lead lines on the base substrate and the orthographic projections of the gate electrodes of the driving transistors on the base substrate, to an area of the gate electrodes of the driving transistors is less than ⅓.

13. The display substrate according to claim 1, further comprising: a plurality of pixel driving circuits arranged in an area defined by the plurality of gate lines and the plurality of data lines; wherein
each of the plurality of pixel driving circuits comprises a driving transistor; and
orthographic projections of the plurality of lead lines on the base substrate do not overlap with an orthographic projection of a gate electrode of the driving transistor on the base substrate.

14. The display substrate according to claim 1, further comprising: an organic insulating layer arranged between a layer where the plurality of data lines are located and a layer where the plurality of lead lines are located; and the plurality of lead lines each is electrically connected with the respective one of the plurality of the data lines through a first via hole penetrating through the organic insulating layer.

15. The display substrate according to claim 14, further comprising: an inorganic insulating layer arranged between the organic insulating layer and the layer where the plurality of lead lines are located: wherein
the plurality of lead lines each is electrically connected with the respective one of the plurality of data lines through a second via hole penetrating through the inorganic insulating layer, and
the first via hole and the second via hole corresponding to each of the plurality of lead lines are arranged in a penetrating mode.

16. The display substrate according to claim 1, further comprising: a plurality of light-emitting devices disposed on one side of the plurality of lead lines facing away from the base substrate: wherein
the plurality of light-emitting devices constitute a plurality of light-emitting device columns extending in the second direction; and
the larger a distance between the light-emitting device columns and a center axis of the display substrate in the second direction, the smaller quantity of light-emitting devices contained in the light-emitting device columns.

17. A display device, comprising the display substrate according to claim 1.

18. The display device according to claim 17, further comprising: a source electrode driving chip, wherein,
the source electrode driving chip comprises a plurality of signal channels;
the plurality of signal channels are electrically connected with the plurality of lead lines in a one-to-one correspondence mode in the bonding area; and
in the first direction, a width of the plurality of lead lines in the bonding area and a width of the plurality of signal channels are equivalent.

19. The display substrate according to claim 1, further comprising: a high-level power line and a reference signal line;
wherein the high-level power line, the reference signal line and the data lines are arranged in a same layer.

20. The display substrate according to claim 11, wherein
each of the plurality of pixel driving circuit comprises a fourth switching transistor, a gate electrode of the fourth switching transistor is electrically connected with a light-emitting control signal line, a drain electrode of the fourth switching transistor is electrically connected with a high-level power line, and a source electrode of the fourth switching transistor is electrically connected with a drain electrode of the driving transistor; and
two adjacent pixel driving circuits share a same fourth switching transistor.

* * * * *